United States Patent
Cronin

[19]

[11] Patent Number: 6,128,685

[45] Date of Patent: *Oct. 3, 2000

[54] METHOD FOR TERMINATING A PROCESSOR BUS

[75] Inventor: Jeffrey J. Cronin, Blaine, Minn.

[73] Assignee: Micron Technology, Inc., Boise, Id.

[*] Notice: This patent is subject to a terminal disclaimer.

[21] Appl. No.: 09/025,388

[22] Filed: Feb. 18, 1998

[51] Int. Cl.[7] ............................ G06F 13/38; G06F 13/40
[52] U.S. Cl. ...................... 710/126; 710/101; 710/128; 710/129; 712/1; 326/30; 375/36
[58] Field of Search ..................... 710/126, 129, 710/101, 128; 712/1; 326/30; 375/36

[56] References Cited

U.S. PATENT DOCUMENTS

| | | | |
|---|---|---|---|
| 4,660,141 | 4/1987 | Ceccon et al. | 364/200 |
| 5,096,090 | 3/1992 | Sshwartz et al. | 221/125 |
| 5,239,559 | 8/1993 | Brach et al. | 375/36 |
| 5,367,697 | 11/1994 | Barlow et al. | 712/1 |
| 5,467,455 | 11/1995 | Gay et al. | 710/101 |
| 5,473,264 | 12/1995 | Mader et al. | 326/30 |
| 5,495,584 | 2/1996 | Holman, Jr. et al. | 710/128 |
| 5,585,741 | 12/1996 | Jordan | 326/30 |
| 5,629,831 | 5/1997 | Eggert et al. | 361/624 |
| 5,706,447 | 1/1998 | Vivio | 710/129 |
| 5,748,910 | 5/1998 | Herrera | 710/101 |

OTHER PUBLICATIONS

Metz, Cade, "Pentium Part II", *PC Magazine,* Jun. 10, 1997, pp. 100–104.
"Hot New Product—FIC PA–2007 Motherboard—First International Computer is one of the first to manufacture a motherboard with 1 MB of Cache," *Computer Source Magazine,* Oct. 1997, pp. 54–55.
"FIC PA–2007 Motherboard," *Computer Source Magazine,* pp. 54–55, Oct. 1997 (best copy).
Metz, Cade, "Pentium Part II," *PC Magazine,* pp. 100–104, Jun. 1997.

*Primary Examiner*—Ayaz R. Sheikh
*Assistant Examiner*—Franz Blanchard Jean
*Attorney, Agent, or Firm*—Perkins Coie LLP

[57] ABSTRACT

A method for terminating a bus configured to have one or more processors coupled thereto. The method comprises coupling a support member having a termination circuit thereon to a conductor of the bus. In one embodiment, the support member is connected to the bus separately from the processor. In another embodiment, the support member is coupled between the bus and the processor. The support member may include an auxiliary circuit in addition to the termination circuit and may be used to correct, supply, or update signals transmitted on the bus.

28 Claims, 6 Drawing Sheets

METHOD FOR TERMINATING A PROCESSOR BUS

TECHNICAL FIELD

The present invention is directed toward a method for terminating a processor bus by coupling a termination circuit to a connector of the bus.

BACKGROUND OF THE INVENTION

Computers, such as desk top computers, typically comprise a monitor, keyboard or other input device, and a chassis which houses the memory, I/O interfaces, chipsets and the processor. As the cost and size of processors decrease, it may be desirable to house several processors in a single chassis and couple the processors together with a bus. The plurality of processors may then process data more quickly and/or may process multiple streams of data simultaneously. The bus may include several connectors, each of which is configured to be coupled to the processor terminals so that several processors may simultaneously be coupled to the bus. The bus may accordingly comprise a plurality of transmission lines, each corresponding to one of the processor terminals. The transmission lines may include data lines, control signal lines, address lines and power lines.

One problem with the above approach for coupling several processors is that the signals traveling along the transmission lines may reflect at the ends of the bus, potentially altering the data transmitted by the bus. One approach to solving the foregoing problem is to terminate the transmission lines with a termination circuit. The termination circuit may comprise a resistor or a resistor/capacitor circuit that is coupled between the transmission line and a selected voltage.

In one application of the foregoing approach, the termination circuits may be placed on a motherboard within the chassis. One problem with this method is that the termination circuits may consume a large portion of the surface area of the motherboard, which might otherwise be used for additional processors, memory, I/O interfaces, or other performance-enhancing components. Another problem is that if the bus contains several connectors, less than all of which are populated with processors, the termination circuits may be separated from the processor by a significant distance. This may be disadvantageous because signal reflections on the bus may not be adequately reduced by the distant termination circuits.

One approach to solving the above problem has been to place the termination circuits on a card which supports the processor and which is coupled to the bus. One problem with this approach may be that if only one of several connectors of the bus is populated with a processor, termination is provided at only one end of the bus. Accordingly, reflections may still occur at the opposite end of the bus which, as discussed above, may have a deleterious effect on the signals transmitted along the transmission lines of the bus.

Another problem with conventional processor and bus arrangements is that processor upgrade circuits and other peripheral circuitry, such as decoupling capacitors, may be positioned on the motherboard. These circuits may take up a significant portion of the motherboard surface area, which might other wise be used for other components.

SUMMARY OF THE INVENTION

The invention is a method for terminating a bus with a support member. The bus is coupled to at least one bus connector which is configured to be coupled to a corresponding connector of a processor. The support member has a termination circuit attached thereto, and the method comprises removably coupling a first support member connector of the support member to the bus connector and removably coupling a second support member connector of the support member to the processor connector, the first support member connector being coupled to the second support member connector and the termination circuit. In one embodiment, the act of removably coupling the first support member connector includes removably coupling a resistor between the first support member connector and a reference voltage. In another embodiment, the act of removably coupling the first support member connector includes removably coupling a capacitor between the first support member connector and a reference voltage. In still another embodiment, wherein the support member comprises another circuit and a first signal which is normally properly transmitted on the bus is improperly transmitted, the method further comprises generating a second signal with the other circuit which is approximately the same the first signal.

In another embodiment wherein the bus is coupled to at least a first and second bus connector, the first bus connector being configured to be coupled to a first processor and the second bus connector being configured to be coupled to a second processor, the method comprises removably coupling the first processor to the first bus connector and removably coupling a support member to the second bus connector such that the first and second processors are spaced apart from the support member. The method further comprises coupling a termination circuit of the support member between the second bus connector and a reference voltage.

DETAILED DESCRIPTION OF THE INVENTION

The present invention is directed toward a device for terminating a processor bus of a computer. The device may eliminate the need for providing termination circuits on the motherboard of the computer and may further provide a location for decoupling capacitors, corrective logic circuits, and other auxiliary circuits which might otherwise be positioned on the motherboard. FIGS. 1–11 illustrate various embodiments of the device, and like reference numbers refer to like parts throughout the figures.

Figure 1A:
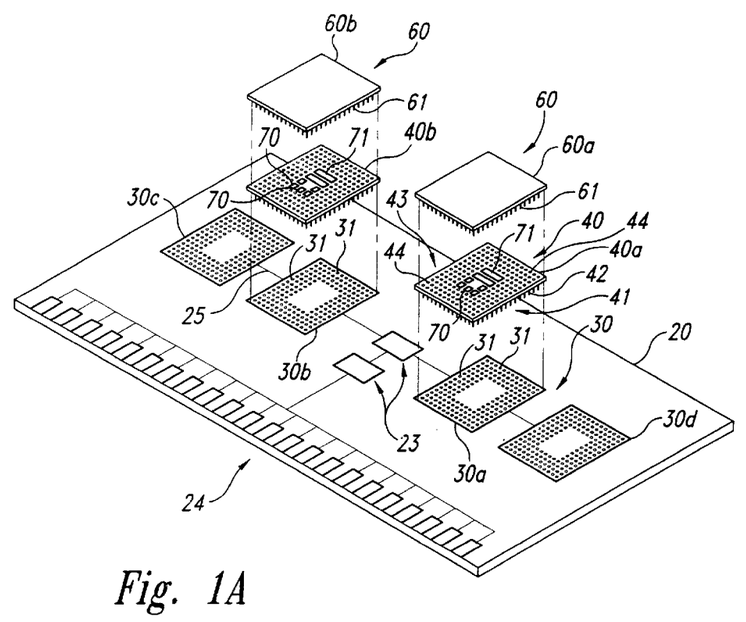
FIG. 1A is a partially schematic exploded top isometric view of a printed circuit board having a bus and a device in accordance with an embodiment of the invention.

FIG. 1A is a partially schematic exploded top isometric view of a printed circuit board (PCB) 20 having a processor bus 25 in accordance with an embodiment of the invention. The processor bus 25 comprises a plurality of conductors which are represented by a single line in FIG. 1 for purposes of clarity. The conductors of the processor bus 25 may transmit data, addresses, and control signals between devices connected thereto. The conductors may also transmit power so that, as used herein, the processor bus 25 refers collectively to conductors transmitting data, addresses, control signals and power. The inductance of the conductors and their capacitive coupling to other components on the PCB 20, such as a ground plane (not shown) causes the conductors to have the characteristics of a transmission line. Thus, the conductors have a characteristic impedance, and if they are not terminated with an impedance matched to the characteristic impedance, signals are reflected from the resulting impedance discontinuity. Electrical components on the PCB 20 that are coupled to the conductor can respond to the reflected signals, thereby resulting in erroneous operations.

A plurality of connectors 30 are positioned on the processor bus 25 and are configured to couple the bus directly to a processor 60 or indirectly to a processor via a support member 40. A chipset 23 is coupled to the processor bus 25 and transmits signals between the processors 60 and other components, such as memory devices and I/O interfaces. In the embodiment shown in FIG. 1A, the other components are positioned on a separate board, such as a motherboard, and the PCB 20 comprises a daughterboard which is coupled to the motherboard via a PCB connector 24. In another embodiment, the processor bus 25 and chipset 23 are positioned directly on the motherboard, as will be discussed in greater detail with reference to FIG. 4.

In the embodiment shown in FIG. 1A, the processor bus 25 is coupled to four connectors 30a–30d. In other embodiments, the processor bus 25 may be coupled to a greater or lesser number of connectors 30 corresponding to the maximum number of processors 60 to be coupled to the bus. Each connector 30 has a plurality of connector contacts 31 configured to engage corresponding contacts 61 of the processor 60. For purposes of clarity, only a fraction of the connector contacts 31 and processor contacts 61 of a typical installation are shown in FIG. 1A. In the embodiment shown in FIG. 1A, the connector contacts 31 comprise sockets, and the processor contacts 61 comprise pins. In other embodiments, the processor bus 25 and processors 60 may be coupled with other connection means, such as solder balls, slotted connectors, and the like.

The support member 40 may be positioned between one of the connectors 30 and a corresponding processor 60. As explained below, the support member may be used to terminate the processor bus 25 adjacent the processor. The support member 40 may have a lower connector 41 comprising lower connector contacts 42 positioned to engage the connector contacts 31 of one of the connectors 30. The support member 40 may further have an upper connector 43 comprising upper connector contacts 44 positioned to engage the processor contact 61 of one of the processors 60. The lower connector contacts 42 are coupled to the upper connector contacts 44 to transmit signals between the processor bus 25 and the processor 60. In an embodiment shown in FIG. 1A, each lower connector contact 42 may comprise a pin which is formed integrally with a corresponding upper connector contact 44. Each upper connector contact 44 comprises a socket configured to engage a corresponding processor contact 61.

Termination circuits 70, shown schematically in FIG. 1, are positioned on the support member 40. The termination circuits 70 are coupled to the lower connector contacts 42 and/or the upper connector contacts 44 to terminate all or a selected number of the transmission lines comprising the processor bus 25. Normally, the termination circuits 70 are coupled to both the lower connector contacts 42 and the upper connector contacts 44 because the connector contacts 42, 44 are coupled to each other. In the embodiment shown in FIG. 1A, five termination circuits 70 are positioned on each support member 40. In other embodiments, the support member 40 may include a greater or lesser number of termination circuits 70, depending on the number of conductors that are terminated. In still another embodiment, the termination circuits 70 may be grouped in packs, with each pack providing termination for a plurality of conductors. The components of the termination circuit 70 are discussed in greater detail below with reference to FIG. 3.

In one embodiment, the support member may further comprise at least one auxiliary circuit 71, which may also be coupled to one or more of the lower and upper connector contacts 42, 44. The auxiliary circuit 71 may perform a variety of functions other than bus termination, as will be discussed in greater detail below with reference to FIGS. 8A–11B.

In one embodiment, the processor bus 25 may be populated with only a first processor 60a. The first processor 60a and a corresponding first support member 40a may be coupled to any connector 30 of the processor bus 25. In one aspect of this embodiment, the first support member 40a may be coupled to the first connector 30a, which is positioned adjacent the chipset 23. By coupling the first support member 40a and first processor 60a adjacent the chipset 23, the time required to transmit signals between the chipset and the first processor may be reduced. The first support member 40a terminates the processor bus 25 on one side of the chipset 23, and may reduce and/or eliminate signal reflections which may interfere with signals transmitted along the processor bus 25. A second support member 40b may be coupled to the second connector 30b to terminate the bus on the opposite side of the chipset 23, further reducing signal reflections.

As shown in FIG. 1A, a user may add a second processor 60b to the processor bus 25 by coupling the second processor to the second support member 40b. The user may add a third processor to the bus by connecting a third support member 40c and third processor 60c to the third connector 30c. In an embodiment shown in FIG. 1B, the user may then remove the second support member 40b to prevent termination between the chipset 23 and the third processor 60c. In another embodiment, the user may leave the second support member 40b in place. Such an embodiment may be advantageous where the second support member 40b comprises an auxiliary circuit 71 which may perform functions other than termination. In one aspect of this embodiment, the user may deactivate the termination circuits 70 of the second support member 40b while leaving the second support member coupled to the second connector 30b. The termination circuits 70 may be deactivated by removing power therefrom, by grounding the circuits, or by other means. In still another embodiment, the user may replace the second support member 40b with a support member having the desired auxiliary circuits 71 and lacking the termination circuits 70.

Figure 1B:
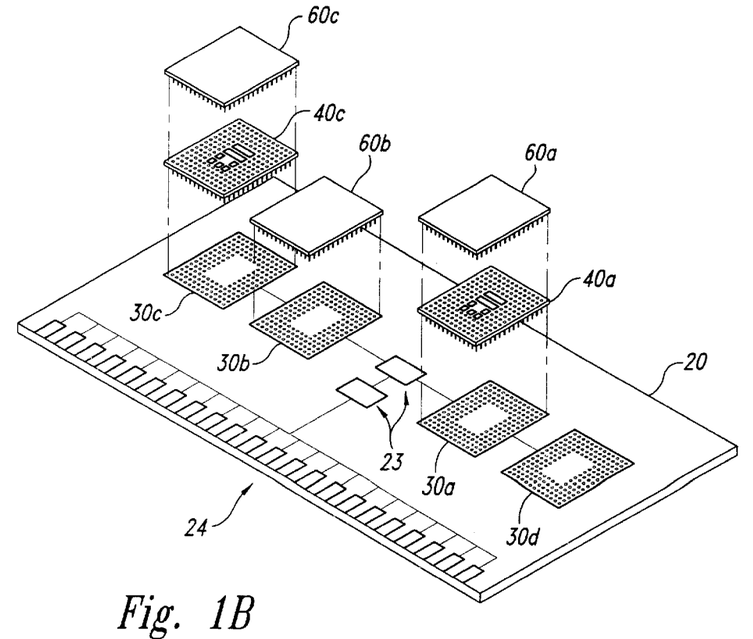
FIG. 1B is a partially schematic exploded top isometric view of the printed circuit board of FIG. 1A having three processors coupled to the bus thereof.

The user may add a fourth support member and fourth processor (not shown) to the fourth connector 30d of the processor bus 25, and remove the first support member 40b so as to prevent termination between the chipset 23 and fourth processor, in a manner similar to that discussed above with reference to the third processor 60c. The processors 60 and support members 40 may be arranged in a similar fashion on a processor bus 25 having a greater or lesser number of connectors 30 so as to terminate each end of the processor bus without providing termination between processors or between a processor and the chipset 23.

Figure 2:
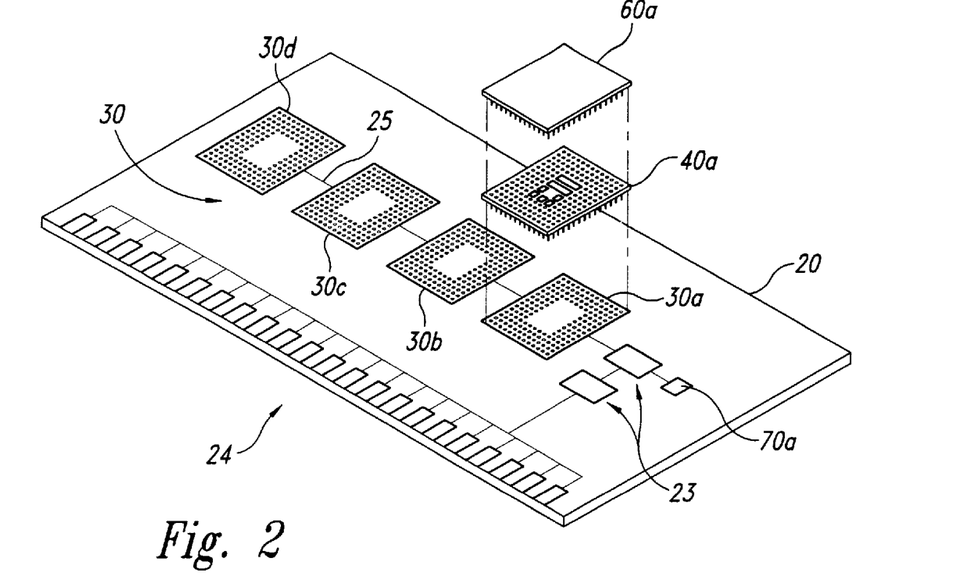
FIG. 2 is a partially schematic exploded top isometric view of a printed circuit board having a bus with a chipset positioned toward one end thereof in accordance with another embodiment of the invention.

FIG. 2 is a partially schematic exploded top isometric view of a printed circuit board 20 having a processor bus 25 with a chipset 23 positioned toward one end thereof. As shown in FIG. 2, the processor bus 25 is terminated on one side of the chipset 23 by a termination circuit 70a that is positioned directly on the printed circuit board 20. The first support member 40a, coupled to the first connector 30a, terminates the processor bus 25 on the opposite side of the chipset 23. As discussed above with reference to FIG. 1A, a single processor 60a may be coupled to the first support member 40a. Additional processors may be added to the processor bus 25 by coupling additional support members 40 and processors 60 to the remaining connectors 30. As discussed above with reference to FIG. 1A, it may be desirable to add each successive processor 60 to the available connector 30 closest to the chipset 23 to reduce signal transmission times between the chipset and the processors. As each additional processor 60 is added, any support members 40 coupled to processors between the added processor and the chipset 23 may be removed or deactivated to remove the termination provided thereby, or may be left in place, as discussed above with reference to FIG. 1B. In another embodiment, the processor bus 25 may be re-routed to place the chipset 23 between two of connectors 30 rather than at the end of the processor bus, which may accordingly reduce the number of termination circuits which are removed or deactivated.

Figure 3:
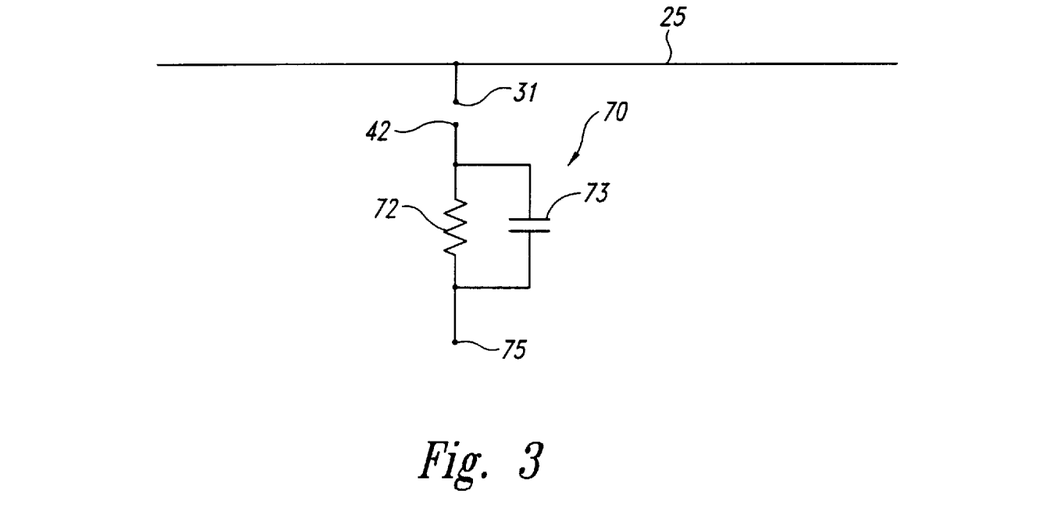
FIG. 3 is a schematic of a termination circuit of the device shown in FIG. 1.

FIG. 3 is a schematic of a termination circuit 70 in accordance with one embodiment of the invention. The circuit may comprise a resistor 72 coupled between a conductor of the processor bus 25 and a reference voltage 75. In one embodiment, wherein the conductor is driven by an open drain transistor, the resistor 72 comprises a pull up resistor. Accordingly, the resistor 72 both terminates the conductor with which it is coupled and pulls the voltage of the conductor up to a selected level to prevent it from floating. The selected level is approximately the reference voltage 75, which may be approximately 1.5 V for a Gunning Transceiver Logic (GTL) bus, and may have other values for other busses, including ground. In one embodiment, the resistor 72 may be coupled to one of the lower connector contacts 42 of the support member 40 as shown in FIG. 3. In other embodiments, the termination circuit 70 may be coupled to the upper connector contact 44 (FIG. 1A) or other components of the support member 40 which are coupled to the corresponding conductor of the processor bus 25.

The termination circuit 70 may further comprise a capacitor 73 coupled with the resistor 72. In one aspect of this embodiment, the impedance provided by the resistor 72 and/or the capacitor 73 is selected to be approximately equal to an impedance of the corresponding conductor to which the termination circuit 70 is coupled. The matched impedance may further reduce signal reflections along the processor bus 25.

One advantage of the support members 40 shown in FIGS. 1A–B is that they support termination circuits 70 which terminate a multi-processor bus 25. This arrangement is advantageous because the termination circuits 70 need not be placed on the PCB 20 or the motherboard of the computer device with which the processors 60 are coupled. Accordingly, the space on the PCB 20 or motherboard normally occupied by the termination circuits may be available for other components, which may enhance the capability of the computer device.

Another advantage of the support members 40 shown in FIGS. 1A–B is that they may be configured to be coupled between existing connectors 30 and existing processors 60. Accordingly, the connectors 30 and processors 60 need not be modified to accommodate the support member 40 and termination circuits 70. Still another advantage of the support member 40 shown in FIGS. 1A–B is that it allows the user to install a single processor 60 in a multi-processor bus 25 while maintaining the ability to easily add additional processors at a later date. Yet another advantage of the support members 40 shown in FIGS. 1A–B is that they may easily be moved from one connector to another as processors are added to, or deleted from, the processor bus 25. The user may change the number of processors 60 coupled to the processor bus 25 and shift the support members 40 accordingly without having to acquire additional support members or discard previously acquired support members.

As shown in FIGS. 1A–B, the support member 40 may be used to terminate a processor bus 25 coupled to a plurality of connectors 30. In another embodiment, the bus may have only a single connector 30 configured to be coupled to a single processor 60. As discussed above, an advantage of this embodiment may be that termination circuits which might otherwise require space on the PCB 20 may be moved to the support device 40, freeing up space on the PCB for other components and devices. Another advantage, as will be discussed in greater detail with reference to FIGS. 8A–11B is that the support member 40 may include auxiliary circuits which may improve the performance of the processor 60 without requiring alterations to either the processor or the PCB 20 to which it is attached.

Figure 4:
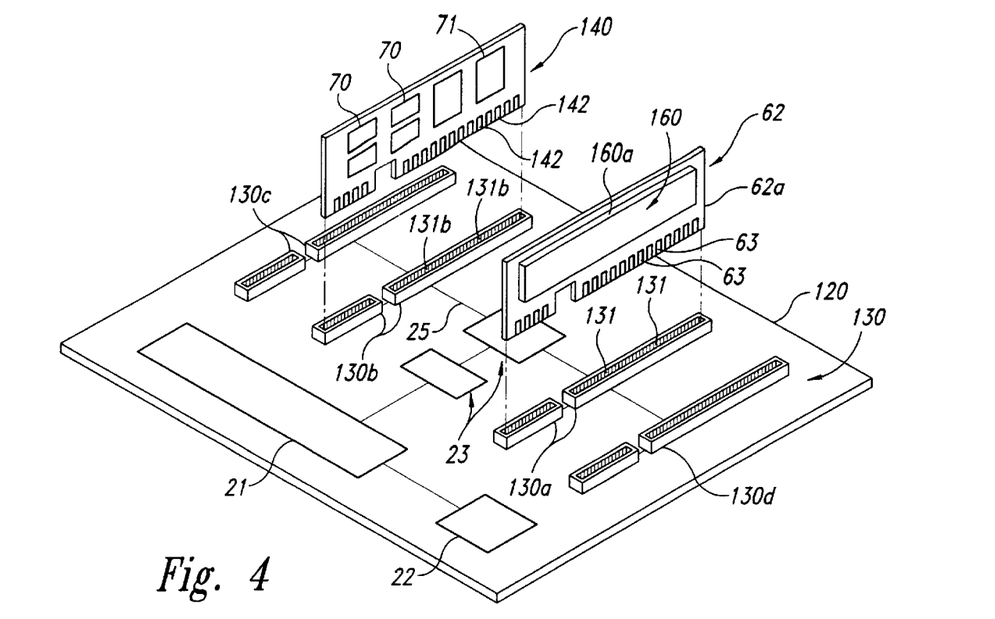
FIG. 4 is a partially schematic exploded top isometric view of a printed circuit board having a bus with a plurality of slotted connectors in accordance with another embodiment of the invention.

FIG. 4 is a partially schematic exploded top isometric view of a PCB 120, which may comprise a motherboard, having a processor bus 25 in accordance with another embodiment of the invention. In the embodiment shown in FIG. 4, the processor bus 25 is coupled to four connectors 130a–130d and may be coupled to more or fewer connectors 130 in other embodiments, substantially as discussed above with reference to FIGS. 1A–B. The chipset 23 is positioned between the first connector 130a and the second connector 130b and is in turn coupled to an I/O interface 21 and memory device 22.

Each connector 130 may comprise a slot having connector contacts 131 therein. The connector contacts 131 are configured to engage corresponding contacts 63 of a processor card 62 which supports the processor 160. The processor 160 and/or the processor card 62 includes termination circuits (not shown), so that when a first processor 160a is coupled via a first processor card 62a to the first connector 130a, the processor bus 25 is terminated on one side of the chipset 23. The bus is terminated on the opposite side of the chipset 23 by the support member 140 which has termination circuits 70 thereon and which may be coupled to the second connector 130b. Accordingly, the support member 140 may comprise a card having contacts 142 positioned to engage corresponding contacts 131b of the second connector 130b. The termination circuits 70 may terminate the processor bus 25 in substantially the same manner as do the termination circuits discussed above with reference to FIGS. 1–3.

Figure 5:
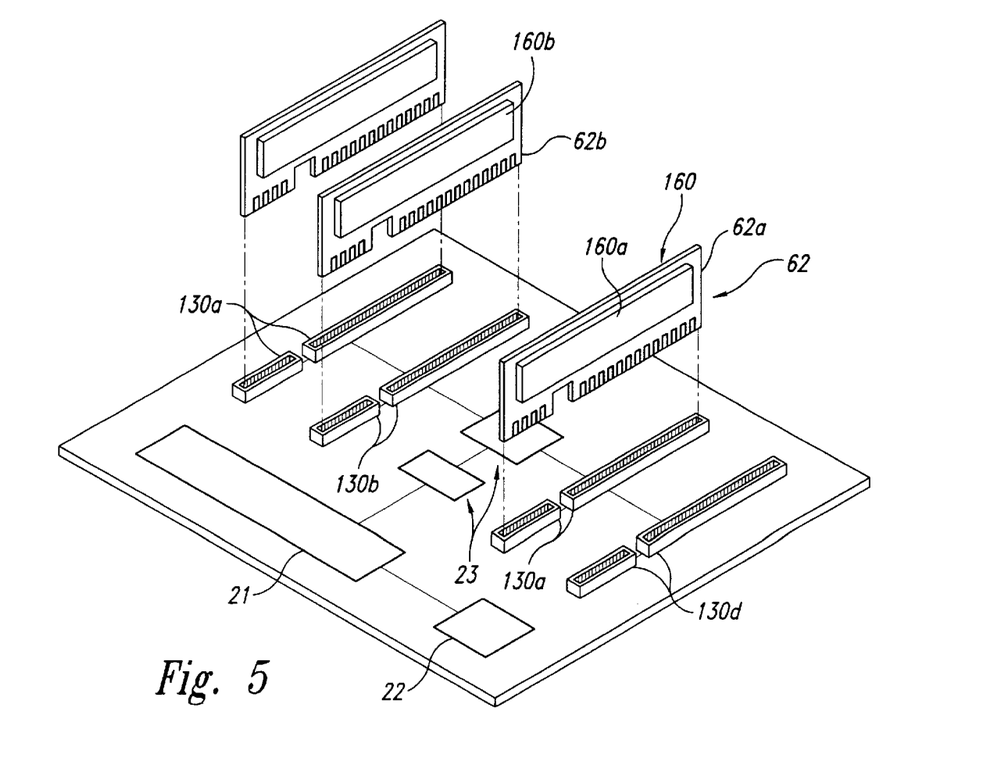
FIG. 5 is a partially schematic exploded top isometric view of the printed circuit board shown in FIG. 4 having three processors connected thereto.

To add a second processor 160b to the PCB 120, the user may replace the support member 140 with the second processor 160b and second processor card 62b, as shown in FIG. 5. As discussed above, the second processor 160b may be connected to the second connector 130b rather than the third connector 130c or the fourth connector 140d to reduce signal transmission times between the second processor and the chipset 23. Once the second processor 160b is coupled to the second connector 130b, the termination circuits included in the card 62 to which the second processor is mounted terminate the processor bus 25. The support member 140 is no longer required to terminate the processor bus 25 and may accordingly be removed. Alternatively, where the support member 140 comprises auxiliary circuits 71 which may be advantageous if they remain coupled to the processor bus 25, the support member may be moved to the third connector 130c or the fourth connector 130d. Accordingly, the termination circuits of the processor 160 positioned between the support member 140 and the chipset 23 may be deactivated by means of any of the processes discussed above with reference to FIGS. 1A–B to avoid termination between the auxiliary circuits 71 and the chipset 23. Alternatively, the termination circuits may remain active.

As shown in FIG. 5, the user may add a third processor 160c by coupling the third processor to the third connector 130c. As discussed above, the termination circuits 70 for the second processor 160b positioned between the chipset 23 and the third processor may be disabled. A fourth processor 160d (not shown) may be added to the fourth connector 130d in substantially the same manner as discussed above with reference to the third processor 160c.

Figure 6:
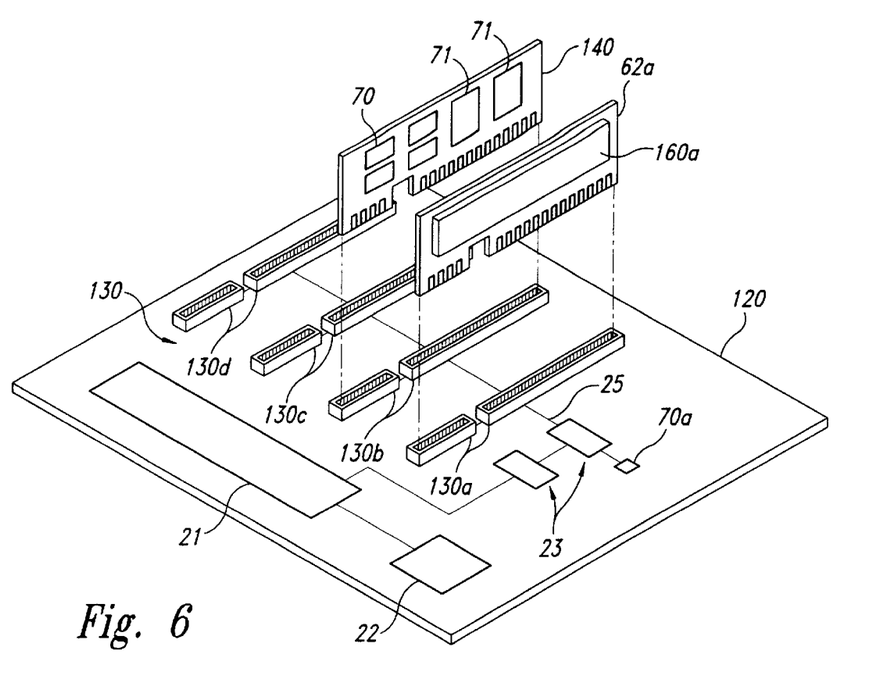
FIG. 6 is a partially schematic exploded top isometric view of a printed circuit board having a bus with slotted connectors and a chipset positioned at the end of the bus in accordance with another embodiment of the invention.
Figure 7:
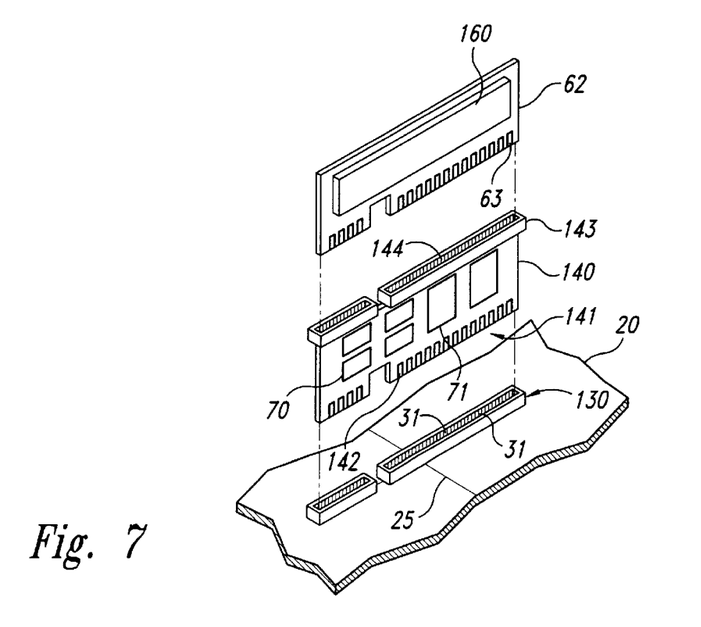
FIG. 7 is an exploded isometric view of a connector, support member, and processor in accordance with another embodiment of the invention.

FIG. 6 is a partially schematic top isometric view of a printed circuit board 120 having a processor bus 25 with the chipset 23 positioned toward one end thereof, in accordance with another embodiment of the invention. As shown in FIG. 6, the first processor 160a is coupled to the first connector 130a to terminate the processor bus on one side of the chipset 23. The processor bus is terminated on the opposite side of the chipset 23 by the termination circuit 70a positioned on the printed circuit board 120. The support member 140 is not required to terminate the processor bus 25; however, it may be coupled to any of the remaining connectors 130b–d if it is desired to couple to the processor bus 25 the auxiliary circuits 71 positioned on the support member. Where the support member 140 is so connected, the termination circuits of any processors 160 positioned between the support member and the chipset 23 may be deactivated, substantially as described above. Alternatively, a support member 140 comprising one or more auxiliary circuits 71 but no termination circuits 70 may be coupled with one of the connectors 130.

In the embodiments shown in FIGS. 4–6, the support member 140 is not positioned between a connector 130 and a processor 160 but rather is coupled to a separate connector because the processor card 62 comprises termination circuits. In another embodiment, shown in FIG. 7, where neither the processor 160 nor the processor card 62 comprise termination circuits, the support member 140 may be configured to be positioned between the connector 130 and the processor card 62. The support member 140 may accordingly comprise a first connector 141 having contacts 142 positioned to engage the corresponding contacts 131 of one of the connectors 130. The support member 140 may further include a second connector 143 having contacts 144 therein positioned to engage the processor card contacts 63. In this embodiment, the support member 140 may be positioned to terminate the processor bus 25 in a manner generally similar to that discussed above with reference to FIGS. 1A–2.

An advantage of an embodiment of the support member 140 shown in FIGS. 4–7 is that it includes connector contacts 142 which may be engaged with a slotted connector 130. Such slotted connectors may be coupled to processors such as the Pentium II produced by Intel, Inc., of Santa Clara, Calif. Conversely, an advantage of an embodiment of the support member 40 shown in FIGS. 1A–B is that it may be used with processors having a socketed connection arrangement, such as the Pentium and Pentium Pro, also produced by Intel, Inc.

Figure 8A:
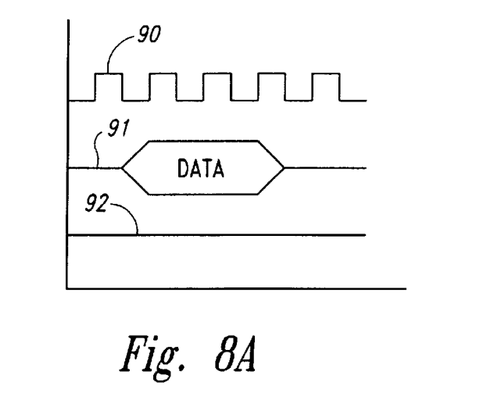
FIG. 8A is a timing diagram of bus signals including a non-operating control signal.
Figure 8B:
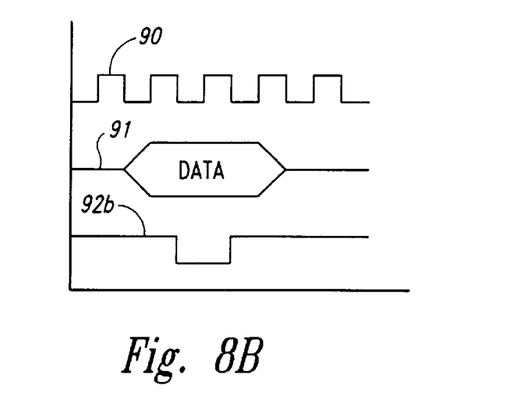
FIG. 8B is a timing diagram of the signals shown in FIG. 7A corrected by an auxiliary circuit in accordance with an embodiment of the invention.

As discussed above, the support members 40 and 140 may comprise one or more auxiliary circuits 71. The auxiliary circuits 71 may perform a variety of functions, as discussed below with reference to FIGS. 8A–11B. FIG. 8A is a timing diagram of signal traces produced by selected transmission lines of the processor bus 25 (FIG. 1A), including a clock signal 90, a data signal 91, and a control signal 92. As shown in FIG. 8A, the control signal 92 is defective because it remains at a constant voltage, and the data conveyed by the data signal is accordingly not transferred to or from the processor bus 25. As shown in FIG. 8B, one embodiment of the auxiliary circuit 71 comprises logic to correct the erroneous control signal 92 by cycling the control signal, producing a corrected control signal 92b.

Figure 9A:
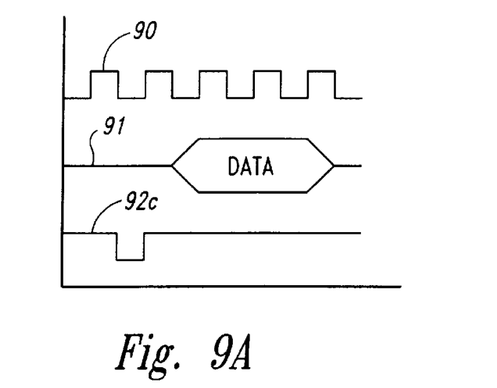
FIG. 9A is a timing diagram of bus signals including an erroneous control signal.
Figure 9B:
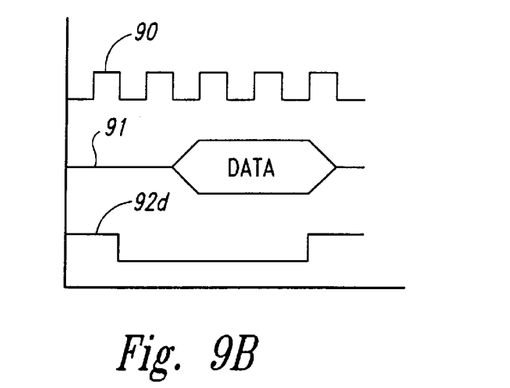
FIG. 9B is a timing diagram of the signals shown in FIG. 8A corrected by an auxiliary circuit in accordance with an embodiment of the invention.

In another embodiment shown in FIG. 9A, the control signal 92c cycles, but does so at a time when the data signal 91 is inactive. Accordingly, as shown in FIG. 9B, another embodiment of the auxiliary circuit 71 comprises logic to lengthen the cycle time of the control signal, as indicated by the corrected control signal 92d, thereby allowing the data to be transferred to or from the processor bus 25.

Figure 10A:
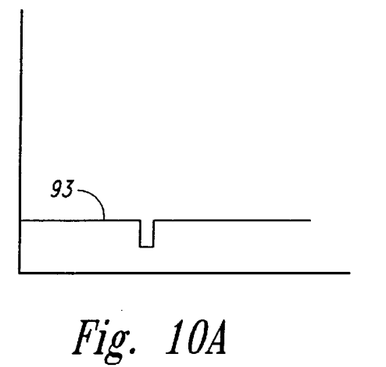
FIG. 10A is a timing diagram of a bus signals having an erroneous reset signal.
Figure 10B:
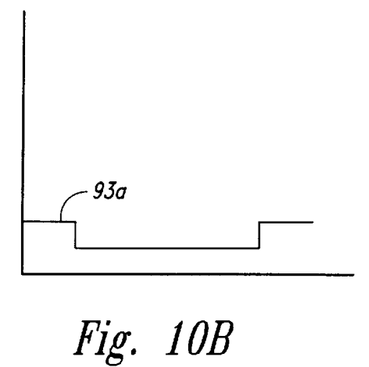
FIG. 10B is timing diagram of the signal shown in FIG. 9A, connected by an auxiliary circuit in accordance with an embodiment of the invention.

FIG. 10A is a timing diagram of a reset signal 93 which is defective because it is too short to reset all the components of the computer device with which it communicates. Accordingly, as shown in FIG. 10B, still another embodiment of the auxiliary circuit 71 comprises logic to lengthen the reset signal to produce the corrected reset signal 93a.

Figure 11A:
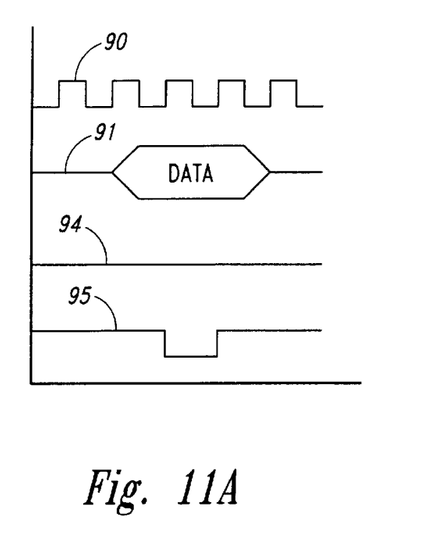
FIG. 11A is a timing diagram of bus signals having an erroneous response signal.
Figure 11B:
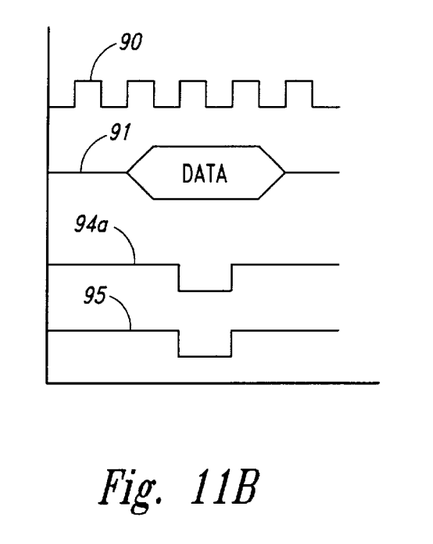
FIG. 11B is a timing diagram of the bus signals of FIG. 10A corrected by an auxiliary circuit in accordance with an embodiment of the invention.

FIG. 11A is a timing diagram showing first and second response signals 94 and 95 which are defective because the first response signal 94 remains at a high voltage and does not cycle. As shown in FIG. 11B, yet a further embodiment of the auxiliary circuit 71 corrects the defective first response signal 94 by cycling it at the proper time, as indicated by the corrected first response signal 94a.

In one embodiment, the auxiliary circuit 71 may be coupled to the processor bus 25 via the support member 40 or 140 without manipulating the conductors comprising the processor bus 25. In another embodiment, the conductors transmitting the erroneous signal may be disconnected, in addition to coupling the auxiliary circuit 71 to the processor bus 25. It may be advantageous to disconnect the conductor where the erroneous signals transmitted thereon may have a deleterious effect on other components coupled to the processor bus 25.

In further embodiments, the auxiliary circuit 71 may comprise a memory circuit or any of a myriad of other circuits which may be added to alter the behavior of the processor 60, the processor bus 25 or devices with which the processor bus is coupled. In one such embodiment, the auxiliary circuit 71 may comprise logic which allows upgrades to any or all of the processors 60 or 160 coupled to the processor bus 25. Such upgrades may include a DC-DC converter which lowers the voltage supplied to the processor and may be used to couple to the processor bus 25 to processors having reduced power requirements. The auxiliary circuits 71 may comprise logic for other types of upgrades as well.

In still another embodiment, the auxiliary circuit 71 may be similar to the termination circuit 70 shown in FIG. 3, but may include only the capacitor 73 and not the resistor 72. The capacitor 73 may accordingly comprise a decoupling capacitor. In one embodiment, the capacitor 73 may be coupled between the reference voltage 75 and one of the connector contacts 42 of the support member 40 shown in FIG. 1A. In another embodiment, the capacitor 73 may be coupled between the reference voltage 75 and one of the connector contacts 142 of the support member 140 shown in FIG. 4. In one embodiment, the reference voltage 75 is ground, so that signals within a selected frequency range are grounded rather than being transmitted to the processor 60 coupled to the support member 40. The capacitor 73 accordingly isolates the processor 60 from voltage signals within a selected frequency range. In one embodiment, the capacitor 73 may be coupled to a conductor supplying power to the processor bus 25 or to one of the processors 60 or 160. In another embodiment, the capacitor 73 may be coupled to another conductor.

An advantage of the auxiliary circuits 71 shown in FIGS. 8A–11B is that they may be positioned on the support member 40, making space available on the PCB 20 for other devices or components. This may be particularly advantageous where the auxiliary circuit 71 includes decoupling capacitors which may be large in size. Another advantage of the auxiliary circuit 71 is that it may be used to supply or correct signals transmitted to the processor 60 or 160 without requiring changes to the PCB 20 or the processor itself.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for terminating a bus with a support member, the bus being coupled to at least one bus connector which is configured to be coupled to a corresponding connector of a processor, the support member having a termination circuit attached thereto, the method comprising:
   removably coupling a first support member connector of the support member to the bus connector;
   removably coupling a second support member connector of the support member to the processor connector, the first support member connector being coupled to the second support member connector; and
   coupling the termination circuit between at least one of the first and second support member connectors and a reference voltage.

2. The method of claim 1 wherein the act of coupling the termination circuit includes coupling a resistor between the reference voltage and at least one of the first and second support member connectors.

3. The method of claim 1 wherein the act of coupling the termination circuit includes coupling a capacitor between the reference voltage and at least one of the first and second support member connectors.

4. The method of claim 3 wherein the reference voltage is ground and the act of coupling the termination circuit includes coupling the capacitor between ground and at least one of the first and second support member connectors.

5. The method of claim 1 wherein the bus has a conductor coupled to the termination circuit, the conductor having an impedance, further comprising selecting an impedance of the termination circuit to be approximately equal to the impedance of the conductor.

6. The method of claim 1 wherein the support member has another circuit and a first signal which is normally properly transmitted on the bus is improperly transmitted, further comprising generating a second signal with the other circuit, the second signal being approximately the same as the first signal when the first signal is properly transmitted.

7. The method of claim 6, further comprising disconnecting a conductor of the bus, the conductor transmitting the first signal.

8. The method of claim 1 wherein the support member has another circuit comprising a capacitor, the method further comprising decoupling at least one of the processor and the bus from a selected voltage with the other circuit, the selected voltage having a selected frequency.

9. A method for terminating a bus coupled to first and second bus connectors, the first bus connector being configured to be coupled to a first processor and the second bus connector being configured to be coupled to a second processor, the method comprising:
   removably coupling the first processor to the first bus connector;
   removably coupling a support member to the second bus connector with all processors being spaced apart from the support member; and
   coupling a termination circuit of the support member between the second bus connector and a reference voltage.

10. The method of claim 9 wherein the act of coupling a termination circuit includes coupling a resistor between the second bus connector and the reference voltage.

11. The method of claim 9 wherein the act of coupling a termination circuit includes coupling a capacitor between the second bus connector and the reference voltage of the bus.

12. The method of claim 9 wherein the bus comprises a chipset coupled between the first and second bus connectors and the act of coupling the termination circuit includes terminating the bus on one side of the chipset.

13. The method of claim 9 wherein the bus comprises a chipset, the second bus connector being coupled to the bus between the first bus connector and the chipset, further comprising deactivating the termination circuit.

14. The method of claim 9 wherein the bus comprises a chipset, the second bus connector being coupled to the bus between the first bus connector and the chipset, further comprising rerouting the bus to couple the chipset between the first and second bus connectors.

15. The method of claim 9 wherein the support member has another circuit and a first signal which is normally transmitted on the bus is not transmitted, further comprising generating a second signal with the other circuit, the second signal being approximately the same as the first signal when the first signal is transmitted.

16. The method of claim 9 wherein the support member has another circuit and a first signal which is normally properly transmitted on the bus is improperly transmitted, further comprising generating a second signal with the other circuit, the second signal being approximately the same as the first signal when the first signal is properly transmitted.

17. The method of claim 16, further comprising disconnecting a conductor of the bus, the conductor transmitting the first signal.

18. The method of claim 9 wherein the support member has another circuit comprising a capacitor, the method further comprising decoupling at least one of the processor and the bus from a selected voltage with the other circuit, the selected voltage having a selected frequency.

19. A method for terminating a bus having at least a first bus connector configured to be coupled to a first processor and a second bus connector configured to be coupled to a second processor, the method comprising:

removably coupling the first processor to the first bus connector;

removably coupling a connector of a support member to the second bus connector;

coupling a termination circuit of the support member between the second bus connector and a reference voltage;

deactivating the termination circuit; and coupling the second processor to the bus by removably connecting the second processor to the support member.

20. The method of claim 19 wherein the act of deactivating the termination circuit comprises removing power from the termination circuit.

21. The method of claim 19 wherein the act of deactivating the termination circuit comprises coupling the termination circuit to ground.

22. The method of claim 19 wherein the act of deactivating the termination circuit comprises removing the support member from the second connector.

23. The method of claim 19 wherein the support member is a first support member and the act of coupling the second processor to the second bus connector includes connecting a second support member to the second bus connector and connecting the second processor to the second support member.

24. The method of claim 19 wherein the act of coupling a termination circuit includes coupling a resistor between the second bus connector and the reference voltage.

25. The method of claim 19 wherein the act of coupling a termination circuit includes coupling a capacitor between the second bus connector and the reference voltage.

26. The method of claim 19 wherein the support member has a second connector coupled to the first connector and to the termination circuit, further comprising coupling the second processor to the second connector of the support member.

27. The method of claim 19 wherein the bus has a conductor coupled to the termination circuit and the transmission line has an impedance, further comprising selecting an impedance of the termination circuit to be approximately equal to the impedance of the conductor.

28. A method for terminating a bus with a support member, the bus being coupled to at least one bus connector which is configured to be coupled to a corresponding connector of a processor, the support member having a termination circuit attached thereto, the bus normally transmitting a first signal, the method comprising:

removably coupling a first support member connector of the support member to the bus connector;

removably coupling a second support member connector of the support member to the processor connector, the first support member connector being coupled to the second support member connector;

coupling the termination circuit between at least one of the first and second support member connectors and a reference voltage; and generating a second signal with another circuit of the support member when the first signal is not transmitted, the second signal being approximately the same as the first signal when the first signal is transmitted.

\* \* \* \* \*